United States Patent
Lenef et al.

(10) Patent No.: US 10,422,499 B2
(45) Date of Patent: Sep. 24, 2019

(54) INTEGRATED PLANAR REFLECTIVE LARP PACKAGE AND METHOD

(71) Applicants: OSRAM GmbH, Munich (DE); Osram Sylvania Inc., Wilmington, MA (US)

(72) Inventors: Alan L. Lenef, Belmont, MA (US); Joerg Sorg, Regensburg (DE); Jan Oliver Drumm, Regensburg (DE); Sergey Kudaev, Regensburg (DE)

(73) Assignees: OSRAM GmbH., Munich (DE); OSRAM SYLVANIA Inc., Wilmington, MA (US)

( * ) Notice: Subject to any disclaimer, the term of this patent is extended or adjusted under 35 U.S.C. 154(b) by 0 days.

(21) Appl. No.: 15/830,069

(22) Filed: Dec. 4, 2017

(65) Prior Publication Data
US 2019/0170314 A1   Jun. 6, 2019

(51) Int. Cl.
| | | |
|---|---|---|
| F21V 11/00 | (2015.01) | |
| F21S 41/176 | (2018.01) | |
| F21S 41/19 | (2018.01) | |
| F21S 41/16 | (2018.01) | |
| F21Y 115/30 | (2016.01) | |

(52) U.S. Cl.
CPC .......... *F21S 41/176* (2018.01); *F21S 41/16* (2018.01); *F21S 41/192* (2018.01); *F21Y 2115/30* (2016.08)

(58) Field of Classification Search
CPC ............... B60Q 1/04; F21K 9/64; F21V 9/20
USPC ................................. 362/509, 510, 511, 512
See application file for complete search history.

(56) References Cited

U.S. PATENT DOCUMENTS

| | | | | |
|---|---|---|---|---|
| 2004/0245535 | A1* | 12/2004 | D'Evelyn | H01L 33/32 257/94 |
| 2015/0062955 | A1* | 3/2015 | Sorg | G02B 6/00 362/553 |
| 2016/0238203 | A1 | 8/2016 | Lenef et al. | |
| 2016/0334552 | A1* | 11/2016 | Lenef | G02B 5/0858 |
| 2017/0015901 | A1 | 1/2017 | Lenef et al. | |

(Continued)

FOREIGN PATENT DOCUMENTS

| | | |
|---|---|---|
| WO | 2015112946 A1 | 7/2015 |
| WO | 2017214464 A1 | 12/2017 |

OTHER PUBLICATIONS

"LaserLight SMD, White light source", Preliminary Product Datasheet 8257, Apr. 2017, Soraa Laser.

(Continued)

*Primary Examiner* — Daniel St Cyr

(57) ABSTRACT

A reflective laser activated remote phosphor (LARP) package comprising: a phosphor platelet oriented in a first plane defined by an x-y plane; a laser diode (LD) positioned to be offset along the x-axis from the phosphor platelet and above the first plane along a z-axis perpendicular to the x-y plane, the LD comprising: an output facet configured for emitting a laser beam (LB), the LB comprising: a slow axis oriented in a first direction along which the LB diverges at a first angle; and a fast axis oriented in a second direction along which the LB diverges at a second angle greater than the first angle; wherein the LD is oriented such that: the LB is bisected by the phosphor platelet such that the slow axis of the LB lies in an x-z plane and the fast axis of the LB is perpendicular to an x-z plane.

18 Claims, 12 Drawing Sheets

(56) References Cited

U.S. PATENT DOCUMENTS

2017/0082263 A1 3/2017 Byrnes et al.
2018/0375001 A1* 12/2018 Ueno ................ B60Q 1/04

OTHER PUBLICATIONS

Peek, "Why the Smart Money is on Laser Illuminiation," Dealing with a Disrupted Light Market, Session 1: Technology Roadmap, Strategies in Light—Europe, Nov. 23-24, 2016, London.

* cited by examiner

INTEGRATED PLANAR REFLECTIVE LARP PACKAGE AND METHOD

TECHNICAL FIELD

Various aspects of this disclosure relate generally to an integrated reflective LARP package.

BACKGROUND

LARP (Laser Activated Remote Phosphor) approaches are being employed in many applications as they may generate much higher luminance than LEDs, and may do so at high power levels. Because of the low étendue of a LARP source, such light sources may also provide highly collimated light from short focal length optics. Generally, LARP sources operate in a transmissive or reflective configuration. As shown in FIG. 1, in a LARP transmissive configuration 100, focused pump light 110 enters a phosphor converter target 120 on one side and the output light 130, both converted 133 and a portion of the pump 135, is collected on the opposite side and collimated light 150 may be emitted from an optical unit 160. Transmissive configurations require a transparent, thermally conductive substrate 140 and some means to retro-reflect the backward generated light from phosphor 120 into the forward direction, such as a dichroic 190. As a result, transmissive configurations 100, while compact, have pump power and intensity limitations which are dictated by the thermal conduction path from the excited region 170 of phosphor 120 to the heat sink to which the substrate 140 is finally mounted. Because phosphor 120 may undergo thermal quenching or loss of quantum efficiency as the local temperature of the phosphor emission region becomes high (above 150-200° C.), the thermal limits on pump power and intensity ultimately limit the total luminous flux and luminance which can be generated by the LARP converter on phosphor 120. Other problems may arise in transmissive configurations 100 including restrictions on the amount of scattering within the phosphor volume, which in turn may limit how well an emission spot is confined, and therefore limit luminance. If scattering in transmissive configurations 100 is increased to improve spot confinement, efficacy decreases because of enhanced backscattering towards the pump. Additional problems with transmissive configuration 100 include significant difficulties finding transparent/translucent but optically non-absorbing bonding materials which may have minimum thermal contact resistance and do not degrade at high temperatures and high blue optical fluxes.

By contrast, in reflective configurations, the focused pump may excite the same surface as the surface which generates the converted light, which may also scatter the pump light. Therefore, the opposite side of the phosphor need only reflect light with minimal loss. Several options are available, including fabrication of mirror surfaces directly onto the phosphor or bonding the phosphor to a high reflective material with a non-absorptive bonding material. The bonding material in a reflective configuration is not limited to transparent adhesives, but may alternatively consist of zinc-oxide filled silicone for example. In the case of an enhanced, metallized mirror applied directly to the phosphor, any high thermal conductivity substrate material may be directly bonded without requirements on optical absorption. For example, an appropriately designed metal mirror may be soldered with thin film metal barrier/solder layer coatings. As a result, reflective LARP configurations may generally withstand greater pump powers and intensities before the phosphor temperature becomes too high. Furthermore, the phosphor may be made with very high scattering to obtain good spot confinement, as high backscattering may actually be beneficial, especially in the case of white conversion where a portion of the pump light may be scattered back in the same direction as the converted light emission. Finally, because bonding materials and substrates may see reduced or no short wavelength pump light, it must only withstand the operating temperatures. In the case of a mirror directly on the phosphor, a large range of high thermal conductivity materials may be used for bonding the mirror to a substrate without regard to optical absorption; therefore, degradation issues can be obviated.

The reflective configuration has two basic variations: 1) use of an external dichroic beam-splitter 220 to pump incident laser light to phosphor 230 mounted on substrate 290 from one optical path 240 and then collect the longer wavelength converted light 280 along another optical path 250 as shown in FIG. 2; and 2) pump the phosphor 320 surface from an off-axis pump beam 310 and then collect both converted light 330 and scattered pump light 340 as shown in FIG. 3.

The configuration in FIG. 2 may be highly optimized and lead to very high collection efficiencies if collimating lenses 260 are chosen carefully. Substrate 290 may be embodied as a heat sink such that the heat sink is a thermal conductor. Additionally, substrate 290 may provide mechanical stability and bonding of phosphor 230 and provide a highly reflective surface. However, this is an expensive configuration and may require a separate optical channel 270 for white light generation.

The alternative reflective configuration 300, FIG. 3 may be far simpler and therefore more compact and less expensive. It may also be well adapted for white light generation; however, off-axis pumping 310 generally requires careful optical design to bring in the focused laser light from a far enough distance so as to permit high collection efficiency of the emitted and scattered blue light 330. In general, spatial scales for good optical pumping and light collection must be small, making the mechanical configuration of all components complicated, especially while trying to take advantage of the high thermal conduction potential of reflective configurations.

Unfortunately, the direct excitation scheme in FIG. 3 may suffer from additional problems which may limit the current applicability. A first issue is that if the optical pumping chain uses either simple spherical/cylindrical optics or even direct excitation from the laser diode, pump beam 310 illuminating phosphor 320 is highly elliptical, implying that the emission spot will also be highly elliptical. In some cases, off-axis pumping 310 exacerbates this problem. Elliptical emission spots are both less desirable for most projection/imaging applications and worsen the thermal problems. A second issue with the direct excitation scheme, especially in applications such as automotive headlights where laser safety is a key issue, i.e. laser light has a specular reflection component 350 which may potentially make its way into the light collection path.

Compact LARP configurations, found for example in automotive applications, have previously only been based on a transmissive configuration. In one case, a ceramic phosphor convertor may be bonded directly to a dichroic coating on a sapphire substrate, similar to FIG. 1. The bonding material is a transparent low temperature glass which is robust to high blue laser fluxes and high phosphor temperatures which are reached during high-intensity pumping. Such approaches can achieve luminances greater than 500-1000 Cd/mm² with luminous fluxes on the order of 300-700 lumens with a few watts of laser power, and an emission spot on the order a few hundred microns. Alternatively, one may expand the spot size to reach higher total luminances with laser pump powers on the order of 10 W, but not significantly increasing luminance.

A second transmissive approach may include methods in which the phosphor material may be contained within a high reflective scattering medium, such as highly scattering alumina, to both confine the emission spot and aid heat conduction away from the pump spot region. The approaches, while they may potentially withstand higher pump powers and therefore generate greater luminous flux, may also still suffer from difficulties with achieving good spot confinement and therefore a high luminance. Additionally, the approaches may still require a non-absorbing, albeit scattering material e.g. alumina, to provide the necessary heat conduction. Also, the phosphor material embedded in the alumina reflector must not be high scattering otherwise there may exist strong backscattering of either pump or converted light.

Static reflective configurations using the configuration in FIG. 2 are presently used in commercial products, such as a medical fiber illuminator, or projection optics 295. Other configurations may employ phosphor on rotating wheels to achieve even higher pump powers, but are still based on the configuration found in FIG. 2.

SUMMARY

Various aspects of this disclosure focus on the reflective configuration LARP source 300 shown in FIG. 3 and provide a method to simultaneously attain a highly optical compact package while retaining excellent thermal conduction properties. In addition, through the use of inorganic optical black coatings within the housing and appropriate light blocking patches, safety from unwanted scattered or direct blue laser pump light may be ensured. Elimination of this scattering within the housing is also important for achieving high contrast between the emission spot region and the rest of the visible surfaces within the package. In headlight applications for example, this background light would translate into additional headlight glare. Careful control of laser diode mounting pedestal surfaces further eliminates unwanted scattering. Furthermore, the system may make use of surface mount technology (SMD) to integrate both the pump laser and conversion components in a single SMD compatible package which is currently not available. This implies the LARP system may have many combined features which not currently achievable in other LARP systems. In particular, a LARP system may permit a complete LARP source 300 in a highly compact package at a lower cost while having the performance benefits of a much more complex and larger reflective configuration. LARP source 300 may comprise a substrate 360 with a bonding layer 370 bonded to a metallic and/or dielectric mirror 380 which may be positioned between phosphor 320 and substrate 360. Finally, the invention solves both the laser diode ellipticity problem and specular reflection problem in a simple fashion.

The LARP system may comprise a laser diode die together with direct excitation reflective conversion. The laser die may be oriented and bonded with respect to the converter such that the slow axis of the expanding laser diode beam, or the less diverging axis, is directly incident onto the convertor platelet, or a phosphor at a high angle. By adjusting the angle appropriately, the emission spot may be made circular or less elliptical without expensive corrective optics which may require much greater physical space.

Furthermore, the laser diode may also be polarized such that the electric field is in the same plane as the slow axis. The high angles of incidence may provide some attenuation of the unwanted specular reflection due to the Brewster angle effect. This may aid the safety and increase the overall efficacy of the system. Implementation of additional optics that are particularly suited to an integrated configuration, such as graded-refractive index (GRIN) lenses and integrated waveguides, may provide further pump optimization and help minimize the interference, or the vignetting, of the laser die to reduce the laser beam divergence and allowing for greater separation between lens and phosphor than by direct excitation from the laser diode. Therefore, the collection efficiency may be increased by these means.

Another purpose for the LARP system may be on the integration side. By using SMD approaches for the laser die (rather than working with the laser die mounted in a TO-can), it is possible to package the entire LARP source on a single planar thermally conductive substrate, eliminating the need for discrete components which have to be mounted in separate machined optical mounts. The SMD approach for the laser die also provides very high thermal conduction to the substrate and permits one to keep the laser footprint at the smallest possible level. Additionally, the complete package itself, with the LARP converter can be hermitically sealed into an SMD package. This leads to high environmental robustness and ease of implementation by OEMs in their applications.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DESCRIPTION

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

Figure 1:
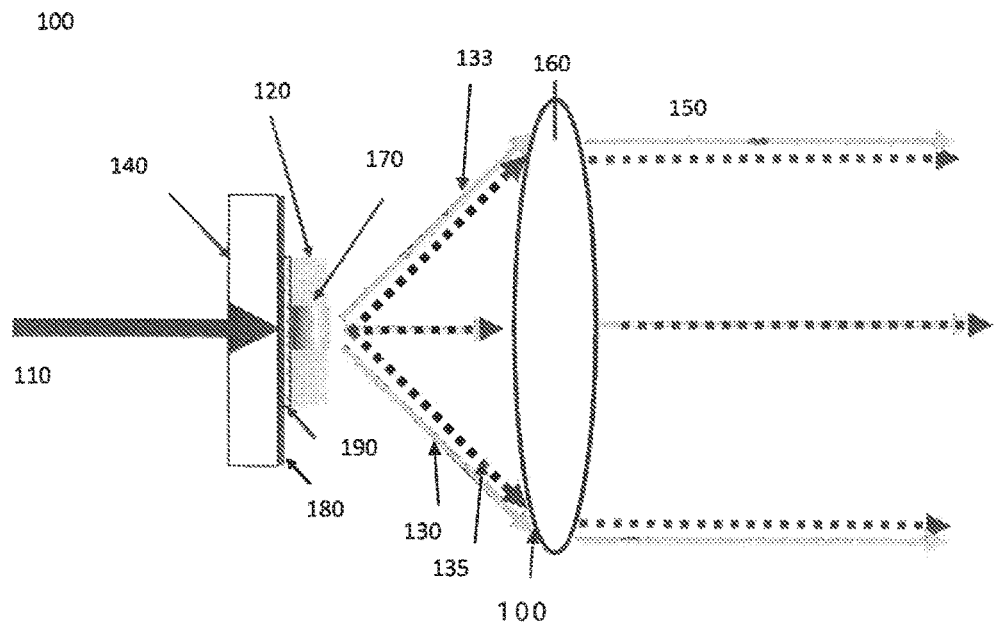
FIG. 1 shows a schematic of typical transmissive LARP geometry.
Figure 2:
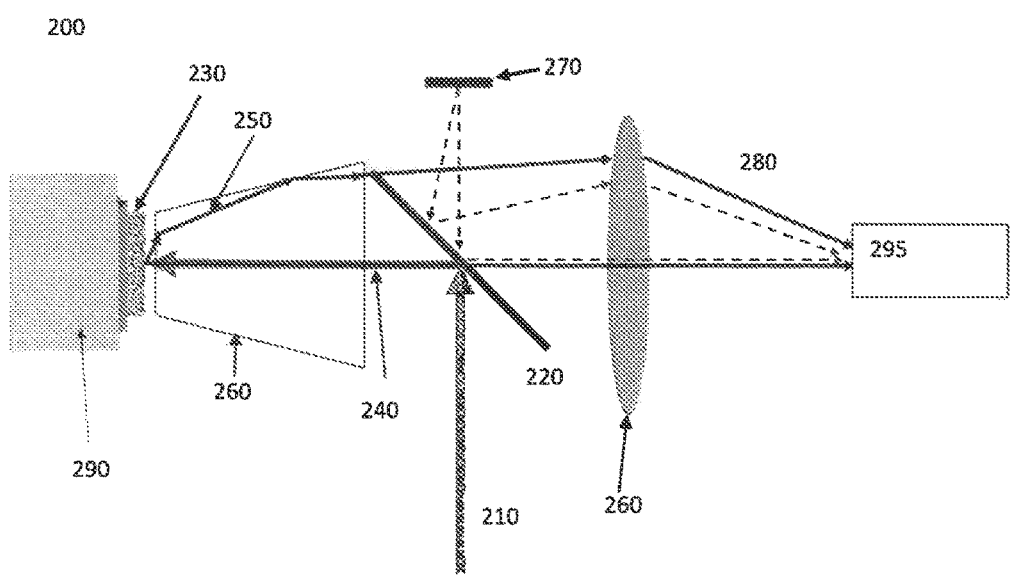
FIG. 2 shows a schematic of a reflective LARP geometry.
Figure 3:
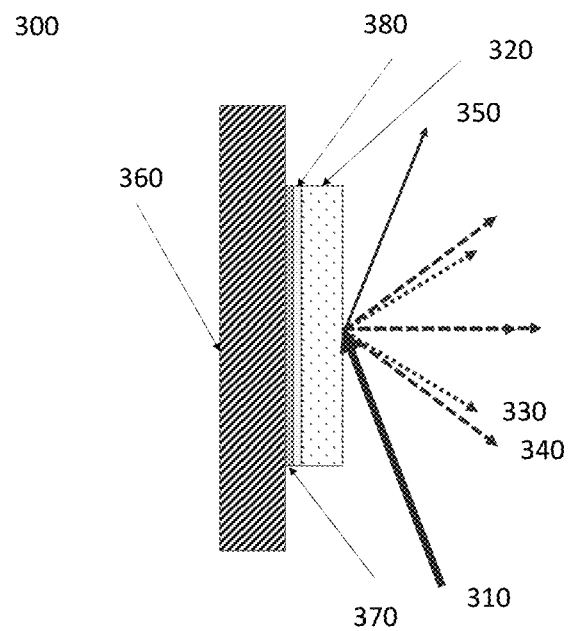
FIG. 3 shows a schematic of a reflective LARP geometry.
Figure 4:
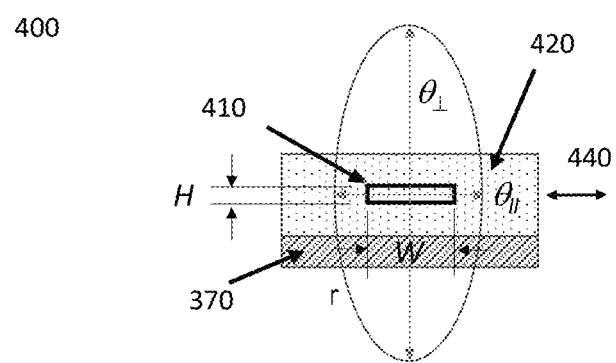
FIG. 4 shows a depiction of an output facet of a laser diode die.

FIG. 4 shows a configuration of a blue laser diode 400, typically ranging in wavelengths from 430-460 nm. Laser diode 400, or laser die, is not limited to visible blue wavelengths, and in general may be in the ultra-violet (UV), visible, or even infra-red (IR) regions of the spectrum, depending on application and corresponding phosphor converter. Typically, high-efficiency, high power laser single diode dies may be of the multi-quantum well (MQW) version, in which a small active region 410, typically of width W on the order of 1-10's µm, height H on the order of 1 µm or less, and a length L of several hundred microns. Active region 410 is surrounded by lower refractive index semiconductor material 420 to confine the amplified light. Facets at either end of the length of the laser die form the reflective mirrors to feedback the amplified radiation to generate laser light. Further, a SMD layer 370 is shown which may mount laser diode 400 to a pedestal in a LARP system.

Because lasing occurs within active region 410 which has a cross-section with length scales on the order of the wavelength of light, the light emerging from an output facet of laser diode 400 has a strong divergence. As height H of active region 410 is usually very small, light diverges most strongly in this direction with a divergence angle, or fast axis $\theta_\perp$, while the axis parallel to width W of active region 410 has a smaller divergence, or slow axis $\theta_{//}$, where width W of active region is in the x-z plane in FIG. 5. Additionally, active region 410 geometry generally forces lasing to occur with the electric field polarization vector 440 oriented parallel to width W of active region 410. In general, many variations on geometry, design, and materials exist for laser diodes, even within the blue wavelength range.

Figure 5:
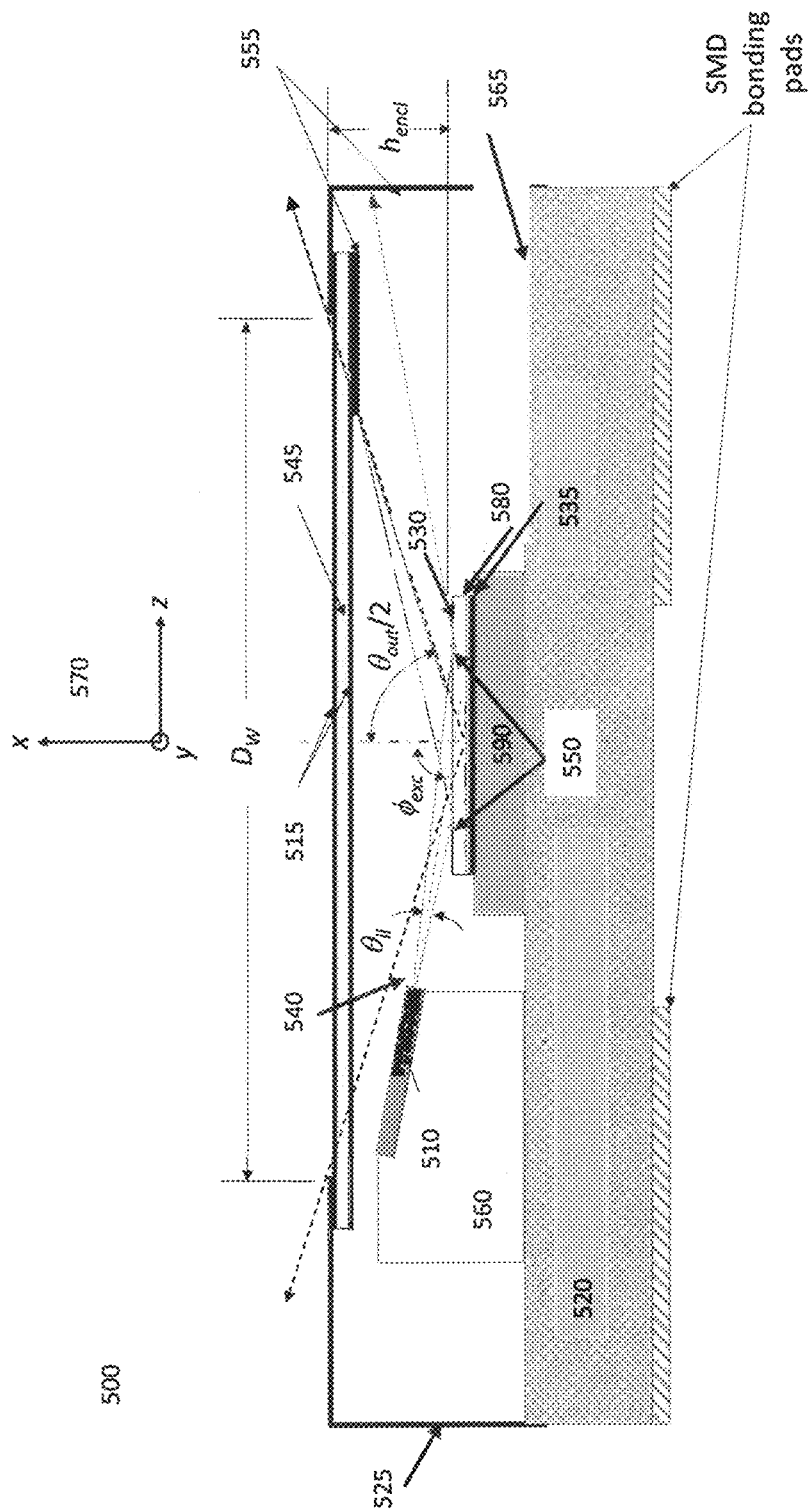
FIG. 5 shows a schematic of an embodiment of a LARP package with an SMD mounted laser diode.

FIG. 5 shows a schematic showing one embodiment of a LARP package 500 with surface mounted technology (SMD) mounted laser diode 510 which may excite a LARP phosphor 530, or phosphor platelet, in an off-axis reflective configuration. Also shown is a coordinate system 570 with respect to phosphor 530. Laser diode 510 may be oriented such that its slow axis $\theta_{//}$ may be vertically oriented with respect to a substrate 520; thus the portion of laser diode 510 with low divergence, or slow axis $\theta_{//}$ may excite phosphor 530 off-axis with an angle of incidence $\phi_{exc}$. Thus, a projection 550 of a laser beam 540 emitted from laser diode 510 along the x-direction may be greatly elongated, while the portion of laser beam 540 projected 550 in orthogonal axis (y-direction) may remain undistorted. Furthermore, the polarization of the laser diode electric field is in the x-z plane, allowing some reduction in specular reflection for this p-polarized light by the Brewster angle effect. To achieve the desired angle of incidence $\phi_{exc}$, laser diode 510 must be pitched accordingly. This may be accomplished by standard SMD soldering techniques with appropriate fixing to mount laser diode 510 onto a laser diode pedestal 560.

Phosphor 530 may typically be configured as a bulk polycrystalline ceramic phosphor is a cerium-activated garnet phosphor which may be represented by the formula $A_3B_5O_{12}$:Ce, wherein A is Y, Sc, La, Gd, Lu, or Tb and B is Al, Ga or Sc. More preferably, the phosphor may be at least one of $Y_3Al_5O_{12}$:Ce, $(Y,Gd)_3Al_5O_{12}$:Ce, and $Lu_3Al_5O_{12}$:Ce. In addition, ceramic phosphors may contain additional phases such as $Al_2O_3$, known in the art, to change scattering behavior, increase thermal conductivity, or achieve certain adhesion properties to with the bonding material. To achieve a wide range of color coordinates or spectral content for the wavelength converter, other phosphors including BAM, nitrides, oxy-nitrides, which may be doped with other rare-earths including $Eu^{2-+}$, $Pr^{3+}$, $Dy^{3+}$ and others, depending on the desired pump wavelength. The ceramic wavelength converter may be formed by a number of conventional ceramic-forming techniques including mixing the phosphor particles with an organic binder, molding the desired shape, and burning out the organic binder followed a final high-temperature sinter to form a monolithic piece.

In addition, phosphor 530 may include single crystal ceramics, or powder phosphor embedded in various inorganic matrix materials such as a low-temperature glass. Other combinations of phosphor powder and lower melting point glasses (phosphor-in-glass) can be used and are well known. It may additionally consist of a free-standing thin film phosphor which may be made by a variety of methods including pulsed-laser deposition (PLD), sputtering, ion-beam, CVD, MOCVD. These methods may also allow the use of conversion materials such as GaN, ZnO, and a variety of other semiconductor materials that require an epitaxial film. This may allow excitation in the UV and emission in the visible. Additionally, various methods to incorporate quantum dots (QDs) into such inorganic matrix materials could be used.

The thickness and scattering properties of phosphor 530 are critical for LARP applications. In the case of bulk polycrystalline ceramic phosphors, scattering lengths may range from below one micron to on the order of a millimeter or more. Volume scattering in ceramic phosphors which may be accomplished by one or more approaches, including the use of pores which may be well controlled in the sintering process, inclusion of other ceramic materials (such as alumina), or through precipitation of second phases. Scattering lengths $l_s$ for Ce:YAG ceramic phosphors used may be on the order of 1-50 μm with platelet 530 thicknesses between 30-500 μm. More preferably, to restrict radial expansion of the transmitted and converted emission spots, 1 μm<$l_s$<10 μm with ceramic platelet thickness t in the range of 30 μm<t<150 μm. This will keep the expansion of the scattered pump and converted emission spots to order of 50-200 μm, with less being commensurate with thinner platelets and smaller scattering lengths. While thinner phosphor platelets may also be used, bulk ceramics become rather fragile. Additionally, such thin samples require higher Ce concentrations to achieve the needed absorption. Higher Ce concentrations also tend to increase thermal quenching (loss of QE with increasing temperature). Thin-film methods may also be appropriate if thin platelets (t<30 μm) are desirable.

Figure 6:
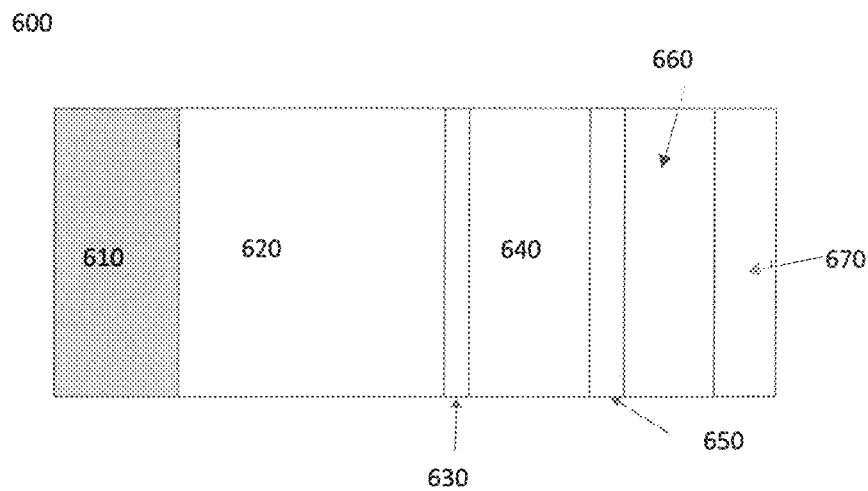
FIG. 6 shows an embodiment of an enhanced Ag mirror coating with solder layers.

A reflective coating 580 on phosphor 530 is critical to the performance of the LARP source. A general approach is shown in FIG. 6, applying a low refractive index buffer layer 620 to the reflective side of a ceramic phosphor 610 to provide strong, preferably lossless, total-internal reflection (TIR) for the fraction of light generated and transmitted towards the mirror side of the phosphor converter. The low refractive index buffer layer 620 should be at least 200 nm thick for visible light, and in general approaching one optical wavelength thickness within layer 620, to minimize evanescent wave interactions with a metallization layer 640 either from TIR waves or scattered light generated from within the phosphor 610 and close to the mirror surface. Furthermore, a second high index "quenching" layer 630 between low index buffer layer 620 and metallization layer 640, on the order of less than 100 nm, may be desirable to further inhibit surface polariton-plasmon (SPP) modes which can be excited by scattering from surface roughness. Quenching layer 630 should be configured to have strong adhesion properties, as adhesion between high reflectance materials such as Ag, which may be found in metallization layer 640, and most oxide dielectrics, such as $SiO_2$, which may make up low refractive index buffer layer 620, is often poor. It has been observed that $TiO_2$ may provide both good SPP quenching and reasonable adhesion to Ag for quenching layer 630. Additionally, a third layer (not shown) may be added in between quenching layer 630 and metallization layer 640 for even greater adhesion. This may include sub-oxides and sub-nm metal nitrides which are known in the art to improve metal adhesion to oxide dielectrics. For even greater reflectivity within the desired spectral bandwidth, additional dielectric layers may be added, although some degradation in thermal conduction may be expected. Finally, it may be desirable to polish phosphor 610 to a surface roughness Ra<20 nm, preferably <5 nm. This may be accomplished by diamond lapping with 1 μm or less polishing powder.

The other side of the metallization layer 640 may have multiple functions, depending on how the coated phosphor 610 may be bonded to a phosphor pedestal 590 (or sub-mount) as shown in FIG. 5. For example, if soldering is used to mount phosphor 530, a metal adhesion layer 650 such as Cr, a diffusion barrier layer 660 potentially comprising Ni (to prevent solder ions from reaching the metallization layer 640, or an Ag mirror), and an inert solder layer 670 such as Au is needed which will not oxidize at soldering temperatures and provide a clean surface. FIG. 6 gives one example of such a coating stack 600. Note that soldering may be accomplished by several means, but the final solidified solder must have a melting point above standard solders used for SMD mounting, in the case in which the complete LARP package 500 is mounted in that way. In general, solder preforms such as Sn—Au are suitable for a bonding layer 535 and bonding the coated platelet 530 to phosphor pedestal 590. Lower temperatures Pb-free solders such as SAC (Sn—Ag—Cu) may also be suitable. Other approaches such as Ag-sintering may also be used.

Phosphor pedestal structure 590 (or sub-mount) may also have certain characteristics to prevent fatigue, cracking, delamination, or other reliability issues. The primary aspect is that the coefficient thermal expansion (CTE) of phosphor 530 should approximately match that of the phosphor pedestal 590. In the case of ceramic phosphors, which typically have thermal coefficients of expansion on the order of 10 ppm/° C. or less, pedestal materials with a good CTE match include high thermal conductivity materials such as AlN, SiC, and CuMo. Pure Cu or Al are much less desirable due to poor CTE matching. Additionally, phosphor pedestals 590 may comprise additional coatings for solderability. This may include the deposition of Ni onto phosphor pedestal 590 followed by deposition of an Au solder pad. Other methods known in the art may also be used.

Figure 7A:
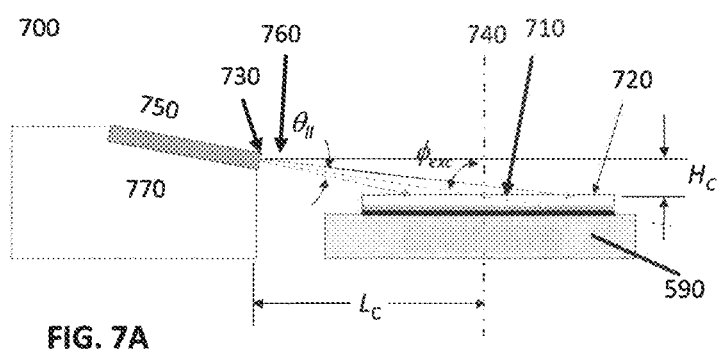
FIG. 7A shows a schematic side view for an embodiment of a LARP package.
Figure 7B:
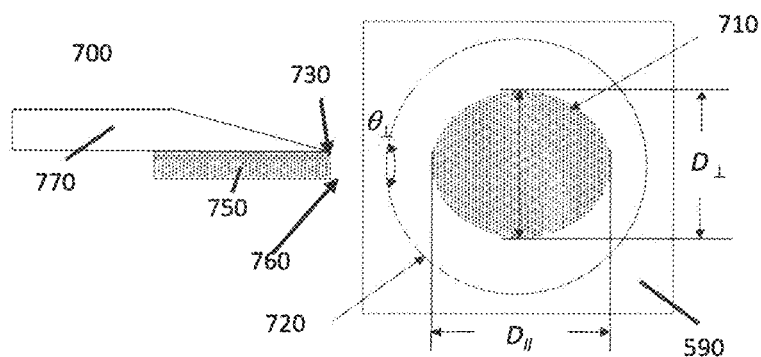
FIG. 7B shows a schematic top view for an embodiment of a LARP package.

Laser diode pedestal 560 which may hold laser diode 510 (and possibly other components such as lenses, waveguides, or other components with optical functions as described in the various embodiments) will have similar constraints as nitride based semiconductors have CTEs on the order of 5-6 ppm/° C. Therefore, laser diode pedestal 560 may be fabricated from similar materials as used for ceramics. SiC is known to be a good material in the case of nitride laser diodes. Such CTE matching laser diode die 510 is especially critical to minimize degradation in laser performance from thermally induced strains. Advantageously, laser diode pedestal 560 may be wedge shaped to aid in preventing the scatter of laser light. As laser diode 510 must be very close to phosphor 530 laser diode pedestal 560 which face phosphor 530 would obstruct much of the high angle emission from the phosphor 530. This may reduce total flux which leaves window 545 and creates additional scattering surfaces for generation of stray radiation within the package. The wedged surfaces of laser diode pedestal as shown in FIG. 7A and FIG. 7B may greatly reduce this obstructing area, increasing output flux and reducing undesired secondary radiation. Additionally, extraneous scattering of any incoherent LD light (amplified spontaneous emission for example) that may emanate from surfaces besides the front facet 730 may be reduced. In general, surfaces of laser diode pedestal 770 may be shaped to minimize scattering of laser diode 750 and phosphor radiation to suppress undesired secondary radiation. The reduction of this stray scattered light is critical in many LARP applications as it contributes to contrast loss and/or glare (such as in automotive headlight applications).

Phosphor pedestal 590 and laser diode pedestal 560 may then be mounted to the final main substrate 520 as shown in FIG. 5. The material for main substrate 520 may be a high thermal conductivity ceramic such as AlN or SiC; such substrate 520 with mounted pedestals 560, 590 may be fabricated in the green state with precision ceramic molding, 3D printing, or other techniques, followed by lapping steps. Alternatively, the ceramic pedestals 560, 590 may be soldered to a less expensive high thermal conductivity Cu substrate 520, where the thermally induced strain will not impact laser diode 510 performance or adhesion of reflective coatings 580 on phosphor 530. Other substrate materials are also usable. Other high thermal conduction methods of bonding pedestals 560, 590 to substrate 520 may be used including Ag-sintering, use of Ag-filled glues, and other methods. Generally, the component approach has the advantage that individual pieces are much easier to manufacture than machining a single substrate/pedestal component.

In another aspect of FIG. 5, dielectric anti-reflection coatings 515 may be used to prevent stray reflections from being visible in any projected beam. Coatings 515 must be resistant to simultaneous application of intense blue light and elevated temperatures and are therefore preferably inorganic. To further minimize stray reflections, substrate surface 565 and possibly pedestals 560, 590 may be anodized or blackened by a non-organic material. In the case of Cu-based alloys, such as CuMo for pedestals 560, 590, sulfur chemistry (e.g.: Potassiumpolysulfide) may be used. Other methods may also be applied such as the so-called "super-black" coating developed in which a nickle-phophate coating is then etched in nitric acid. Other approaches may include using carbon nano-tube (CNT) coatings.

Finally, as laser diode 510 may be in a hermitically sealed environment, the whole package 500 may be sealed in a container 525 or housing with a large window 545 on top to provide a very high angular cone view of phosphor platelet 530. A non-window portion 555 of container 525 may also be blackened to eliminate stray light. The same procedures used for substrate surface 565 may be applied here.

Typically, many applications require the cone to satisfy $\theta_{out}/2 > 60°$, preferably $\theta_{out}/2 > 75°$ to minimize losses. The diameter of the unobscured portion of the window $D_W$ must therefore satisfy the following inequality:

$$D_W \geq 2h_{encl} \tan(\theta_{out}/2). \quad (1)$$

Thus to achieve $\theta_{out}/2=60°$, assuming $h_{encl}=5$ mm, $D_W=17.3$ mm. In another example, if $\theta_{out}/2=75°$, $h_{encl}=3$ mm, $D_W=22.4$ mm. Therefore, a hermetically sealed LARP source 500 as described must have lateral dimensions on the order of a couple of centimeters.

Window 545 may be made of a number of transparent materials such as glass, sapphire, and others, depending on wavelengths that exit the device. For example, near-UV or UV excitation may be desirable for some full-conversion applications; in this case window 545 may additionally consist of a UV absorbing glass to prevent escape of dangerous UV or near UV radiation.

In one embodiment a design may be developed based on the configuration in FIG. 5. Referring to FIGS. 7A and 7B, an excitation spot 710 on phosphor platelet 720 may be shown from simple geometry that the width of the elongated dimension (z-axis in FIG. 5) and may be given by the following formula:

$$D_{\parallel} = 2H_c \frac{\tan(\theta_{\parallel}/2)}{\cos^2\phi_{exc} - \sin^2\phi_{exc}\tan^2(\theta_{\parallel}/2)}. \quad (2)$$

For the dimension (y-axis in FIG. 5), the width is $$D_{\perp} = 2\sqrt{L_c^2 + H_c^2} \tan(\theta_{\perp}/2) = 2H_c \frac{\tan(\theta_{\perp}/2)}{\cos\phi_{exc}}. \quad (3)$$

where the relation between $\phi_{exc}$ and the distances between the laser diode emitting facet 730 is used and a center 740 of phosphor platelet 720 is:

$$\frac{L_c}{H_c} = \tan\phi_{exc}. \quad (4)$$

Finally, this leads to the formula for the ratio α of the two widths:

$$\alpha \equiv \frac{D_{\perp}}{D_{\parallel}} = \frac{\tan(\theta_{\perp}/2)}{\tan(\theta_{\parallel}/2)} \cos\phi_{exc}[1 - \tan^2\phi_{exc}\tan^2(\theta_{\parallel}/2)] \quad (5)$$

It may be noted that the elliptical "pump beam spot" or excitation spot 710 shown in FIG. 7 is only approximate; the real spot would be narrower than shown when closer to laser diode 750, and broader when further from the laser diode 750, because of the distance from laser facet 730 to a point on the z-axis increases as one moves away from the laser diode 750. Therefore the excitation spot 710 may expand.

As an example, a typical high power 3 W laser diode from OSRAM Opto has $\theta_{\perp,FWHM}=27°$ and $\theta_{\parallel,FWHM}=7°$ full-width half-maximum (FWHM) angular spread. These correspond to more relevant $1/e^2$ widths, $\theta_{\perp}\pm=63.5°$ and $\theta_{\parallel}=16.5°$. A typical phosphor platelet may have a diameter of 2.0 mm. Thus, a practical closest distance $L_c=1.0$ mm. Under these conditions, calculations from equations (2)-(5) may be used to predict the ideal angle of excitation $\phi_{exc}$, approximate spot size, and degree of approximate circularity (α=1). The results for this example may be found in FIGS. 8-13.

Figure 8:
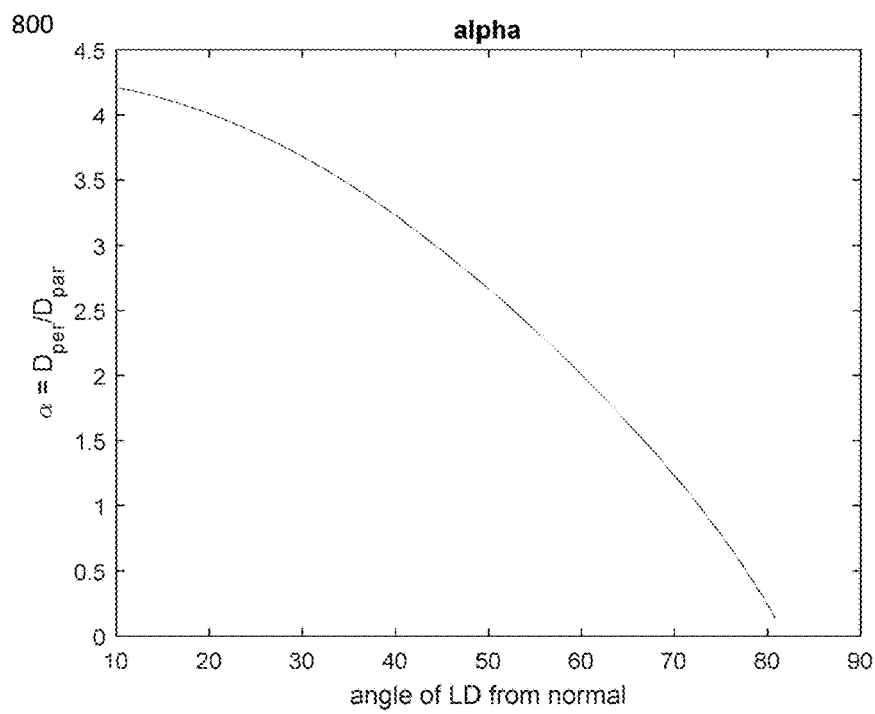
FIG. 8 shows a plot of the ratio of perpendicular to parallel axes of pump beam illumination pattern on phosphor plate as a function of angle of incidence $\phi_{exc}$.

FIG. 8 shows a plot 800 which indicates the ratio of perpendicular to parallel axes of pump beam 760 elimination pattern on phosphor plate 720 as a function of angle of incidence $\phi_{exc}$. It may be observed that the most circular spot 710 (α=1) occurs at the relatively high angle of incidence $\phi_{exc}=72.5°$. This is independent of distance $L_C$, depending only on the laser diode 730 divergence angles $\theta_{\perp}$ and $\theta_{\parallel}$.

Figure 9:
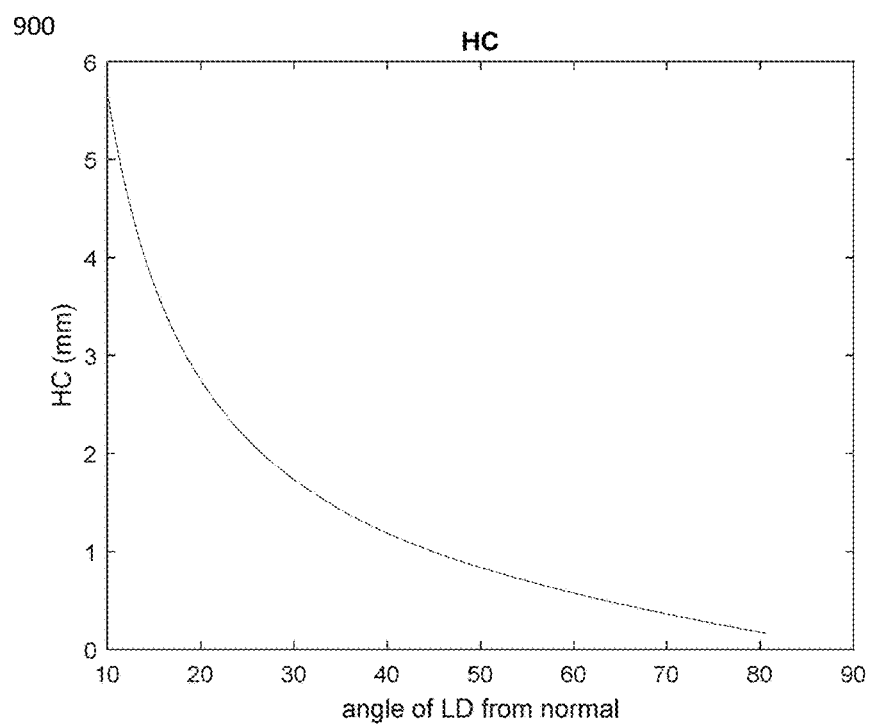
FIG. 9 shows a plot of required height $H_C$ of laser die with respect to phosphor plate surface as a function of angle of incidence $\phi_{exc}$.

FIG. 9 shows a plot 900 of required height $H_C$ of laser diode 750 with respect to phosphor 720 surface as a function of the angle of incidence $\phi_{exc}$. To achieve a circular spot, this may imply laser die facet 730 is very close to the phosphor with $H_C=0.31$ mm.

Figure 10:
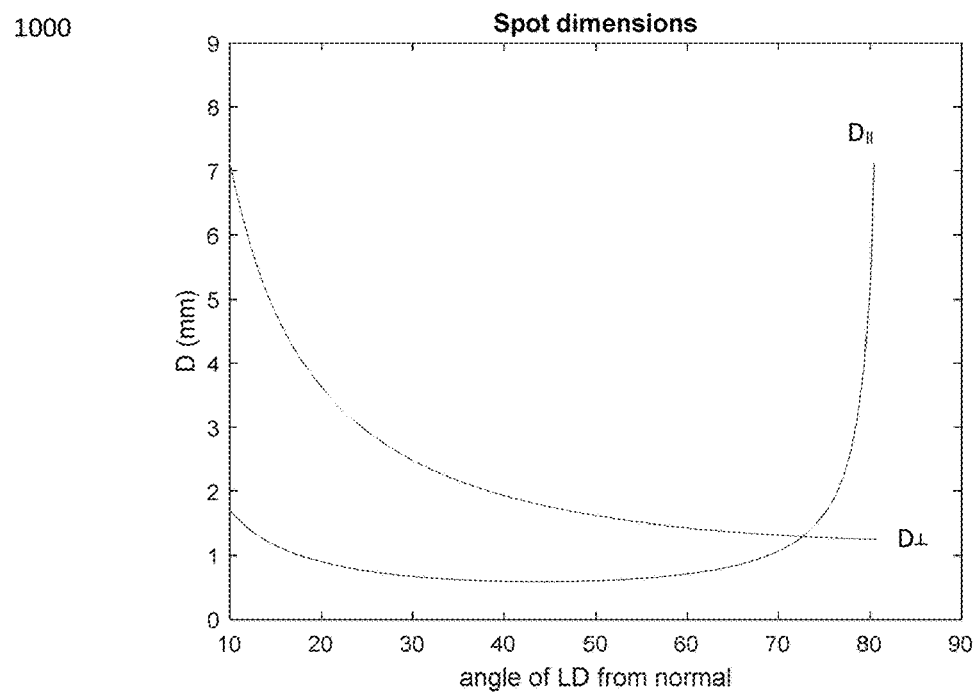
FIG. 10 shows a plot of approximate widths of parallel (z-axis) $D_\parallel$ and perpendicular $D_\perp$ (y-axis) axes as function of angle of incidence $\phi_{exc}$.

FIG. 10 shows a plot 1000 showing approximate widths of parallel (z-axis) D parallel and perpendicular D perpendicular (y-axis) axes as a function of angle of incidence $\phi_{exc}$. At the condition for a circular spot, the corresponding spot size $D_{//}$, $D_{\perp}$ width along the two axes from FIG. 10 is about 1.3 mm ($1/e^2$).

Figure 11:
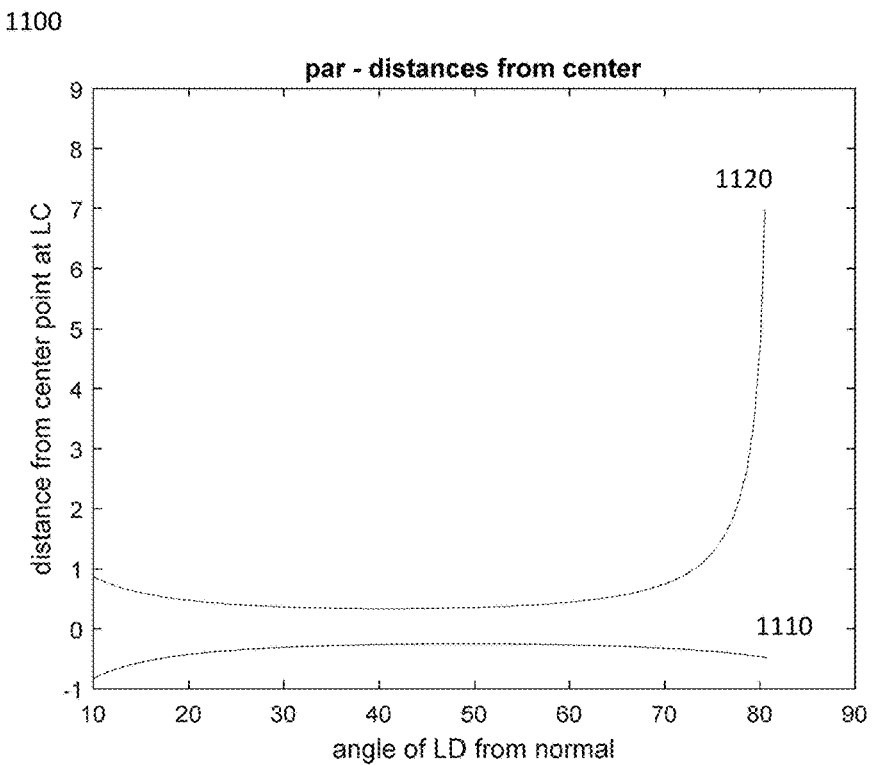
FIG. 11 shows a plot of deviation along parallel axis (z-axis) of projected laser spot on phosphor from center for point on laser spot closest and furthest from laser diode as function of angle of incidence $\phi_{exc}$.

FIG. 11 shows a plot 1100 of the deviation along the parallel axis (z-axis) of projected laser spot 710 on phosphor 720 from center 740 for point on laser spot 710 closest 1110 and furthest 1120 from laser diode 750 as function of angle of incidence $\phi_{exc}$. FIG. 11 shows excitation spot 710 may fit within phosphor platelet 720 and not be obstructed by laser diode pedestal 770, i.e., the closest $1/e^2$ point on excitation spot 710 is still about 0.65 mm from laser pedestal 770 under the circular spot condition ($\phi_{exc}$=72.5°). Advantageously, phosphor platelet 720 diameter may be reduced without being obstructed by the laser pedestal 770. However, alignment will become more difficult and we suspect achieving round spot sizes. In this embodiment, pump spot sizes below 1 mm would require laser diodes 750 with smaller divergences.

Figure 12:
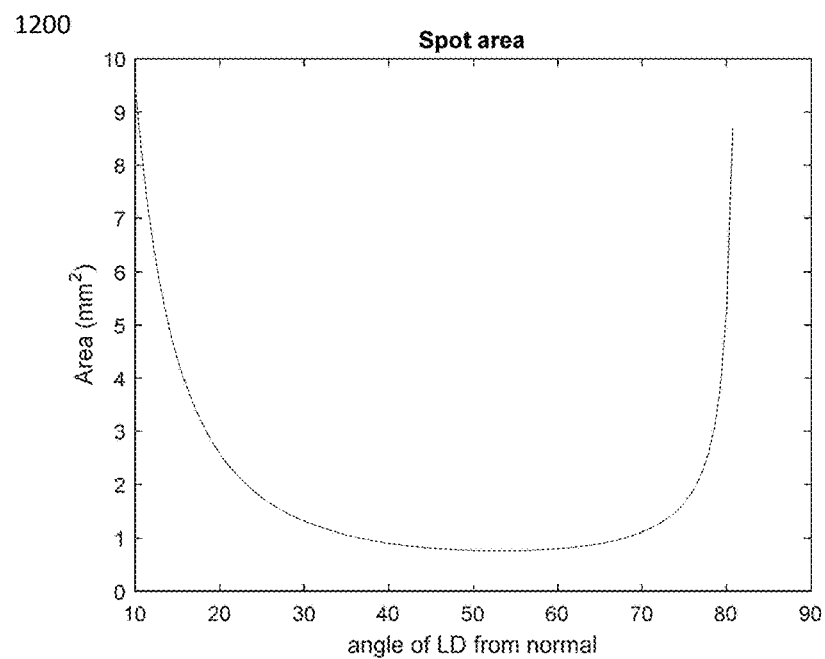
FIG. 12 shows a plot with an "elliptical" pump spot area projected onto phosphor platelet as function of angle of incidence $\phi_{exc}$.

FIG. 12 shows a plot 1200 with an "elliptical" pump spot 720 area projected onto phosphor platelet 720 as function of angle of incidence $\phi_{exc}$.

Figure 13:
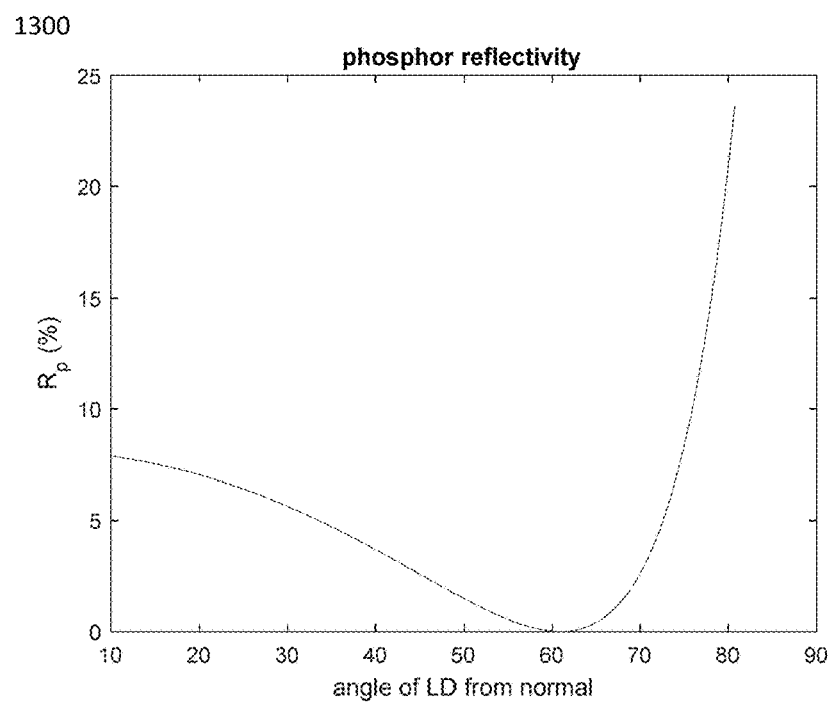
FIG. 13 shows a plot of the reflectance of incident laser beam from phosphor plate as function of angle of incidence $\phi_{exc}$.

FIG. 13 shows a plot 1300 indicating the reflectance of incident laser beam 760 (p-polarized) from phosphor platelet 730 as function of angle of incidence $\phi_{exc}$. Results may assume a ceramic YAG phosphor has refractive index $n_{ph}$=1.80 and pump beam light 760 is propagating in air.

To further understand the potential performance of this embodiment, especially with respect to optimizing luminance (or radiance), FIG. 12 shows a plot of the estimated (assumed elliptical) spot area versus the angle of incidence, and FIG. 13 shows the corresponding specular reflectance $R_p$ (p-polarized) incident laser light. The results of FIG. 12 show that the incident pump spot area 710 actually has a broad minimum near 50°, substantially lower than the circular point. Furthermore, the Brewster angle also occurs at 60.9°, a lower angle than the circular pump spot condition. Therefore, if a non-circular beam 760 may be tolerated, a highest overall luminance in a relatively non-critical region of 55°-65° may be attained due to the combined effect of smallest spot area and lowest specular pump reflection. The laser height ranges from a respective 0.7-0.5 mm, alleviating some of the possible alignment problems. Laser excitation spot 710 in the perpendicular (y-axis) direction is still within the diameter of a 2 mm phosphor platelet 720.

Figure 14A:
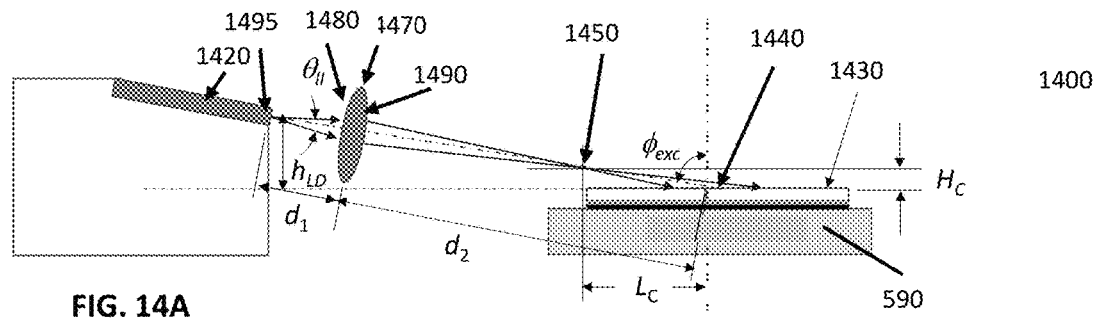
FIG. 14A shows a side view schematic with off-axis excitation using lens system to move laser further from converter target to reduce allowable spot size.
Figure 14B:
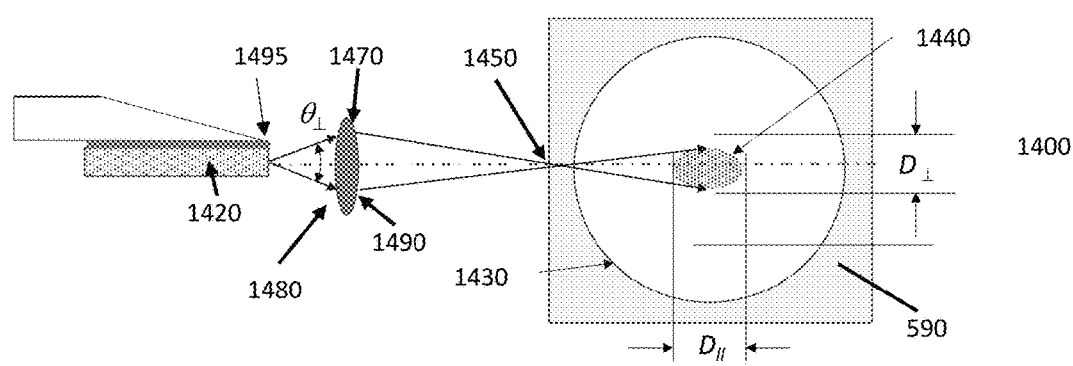
FIG. 14B shows a top view schematic with off-axis excitation using lens system to move laser further from converter target to reduce allowable spot size.

In a second embodiment, additional pump light focusing optics may be used to reduce the angular spread of the pump light, allowing for smaller projected pump spot sizes on the phosphor and allowing one to move the laser die further from the phosphor. FIG. 14 comprises a schematic showing off-axis excitation 1400 using lens system 1470 to move laser 1420 further from converter target 1430 to reduce allowable spot 1440 size. The image point 1450 is shown where the rays from the lens cross. One may employ a small aspheric lens on the order of millimeters in diameter to re-image the laser spot 1440 from a much further distance than without such a lens. Many single or multi-optic imaging systems may be used, although a simple molded aspheric lens can provide a cost-effective and simple solution.

In this second embodiment, the physical objects, such as laser diode 1420 and lens system 1470, may be moved much further away from converter target 1430 or the phosphor, resulting in a much smaller obscuring solid-angle and permitting much closer placement of a high numerical aperture (NA) collimating/collecting optic. Furthermore, there are no physical constraints which may limit the location of the image point 1450 in FIG. 14, therefore allowing $L_C$ to approach zero or to make an image on the phosphor before the imaging point 1450 location. In one example, a small aspheric lens may comprise lens system 1470 with an effective focal length f=1.45 mm, working distance of flat face to laser=0.81 mm, 1 mm total thickness, NA=0.58, clear aperture of 1.60 mm, and overall diameter of 2.8 mm (Thorlabs 354140-A) may provide the needed laser diode spot 1440 formation in FIG. 14B. This lens 1470 may have a first surface 1480 which may be a flat surface and a second surface 1490 may be a curved surface. Setting first surface 1480 of lens 1470 to face laser diode 1420, and setting the magnification M=5, then the standard thick lens image formula can be applied to give the distances $d_1$ and $d_2$. One would find the image distance $s_i$=6×1.45 mm=8.7 mm to the second principle plane which lies tangent the curved surface of the lens and perpendicular to the optic axis. This implies that the distance $d_1$ is given by the formula:

$$d_1 = (M+1)f + \frac{L_c}{\sin\phi_{exc}} = 8.7 \text{ mm} + \frac{1 \text{ mm}}{\sin\phi_{exc}} \qquad (6)$$

where the second equality is for this specific example. From the effective focal length and working distance, the first principle plane lies 0.64 mm from the flat lens surface. The corresponding distance from the first principle plane to the laser diode is given by $s_i$=$(1/f - 1/s_0)^{-1}$=1.74 mm in the example. This gives $d_1$=2.1 mm and a distance of the laser facet to first lens surface of 1.1 mm. This requires an illuminating $1/e^2$ diameter of at least 1.35 mm on the flat lens surface 1480, well within the 1.60 mm clear aperture of lens 1470.

Figure 15:
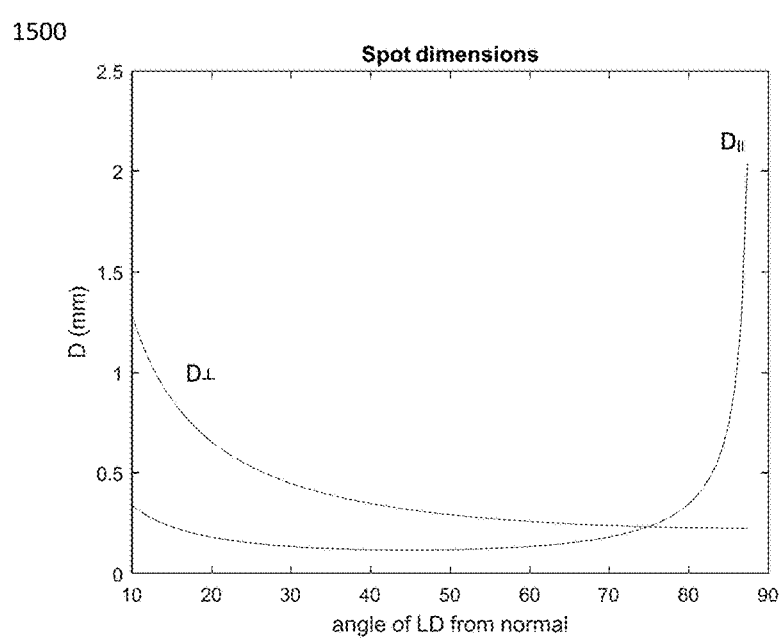
FIG. 15 shows a plot showing approximate widths of parallel (z-axis) $D_{//}$ and perpendicular $D_\perp$ (y-axis) axes as function of angle of incidence $\phi_{exc}$ for second embodiment with lens.

FIG. 15 illustrates an example of a plot 1500 where spot 1440 size on converter target 1430 may be much smaller than achievable without lens 1470. Plot 1500 shows proximate widths of parallel (z-axis) $D_{//}$ and perpendicular $D_{\perp}$ (y-axis) axes as function of angle of incidence $\phi_{exc}$ for second embodiment with lens 1470. For an angle $\phi_{exc}$=700, which provides a good compromise between Brewster angle transmission (as shown in FIG. 13), more symmetric spot size and minimal spot area. The spot dimensions at $\phi_{exc}$=70° are $D_{//}$=0.182 mm and $D_{\perp}$=0.237 mm. This gives a height of the laser diode facet 1495 with respect to converter target 1430 of $h_{LD}(d_1+d_2)\cos\phi_{exc}$=3.69 mm. This implies the package height can still be relatively small. Of course, different spot sizes may be generated by several methods, including changing the position of the image with respect to the phosphor $L_C$, magnification M, and lens focal length f.

Figure 16A:
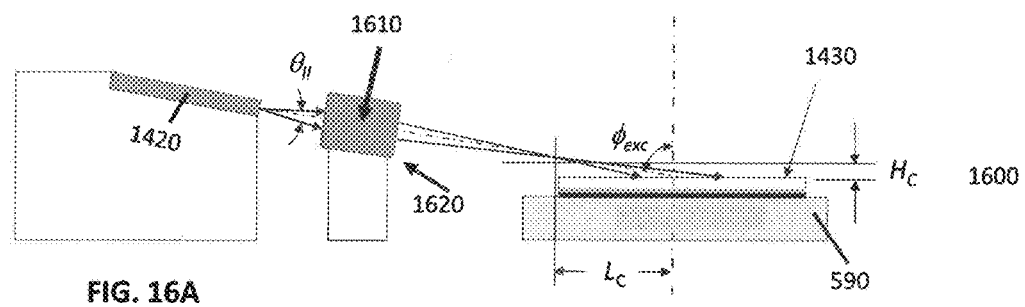
FIG. 16A shows a side view schematic showing off-axis excitation using GRIN lens.
Figure 16B:
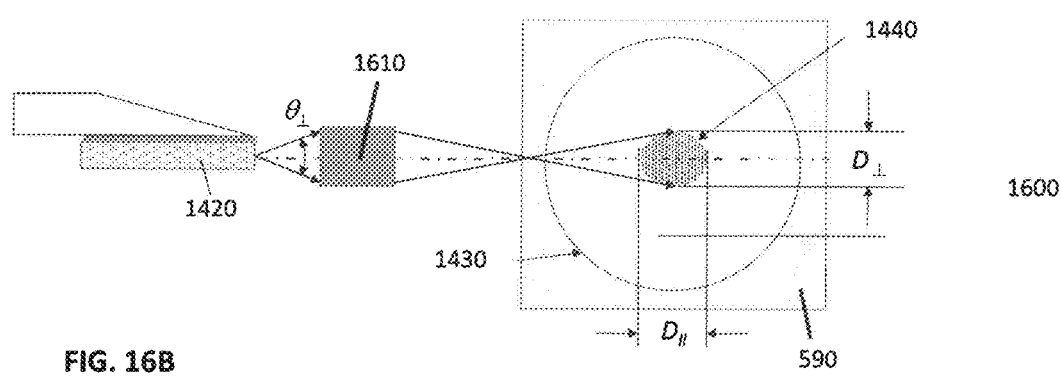
FIG. 16B shows a top view schematic showing off-axis excitation using GRIN lens.

FIG. 16A and FIG. 16B show a third embodiment of a LARP package 1600, where FIG. 16A shows a side view and FIG. 16B shows a top view. The schematic showing off-axis excitation uses GRIN lens 1610 to further decrease component sizes and improve packaging 1600. The image point is shown where the rays from the lens cross. The conventional aspheric lens may be replaced by a high-NA gradient index (GRIN) lens 1610 which may be better integrated into the package 1600. Commercial near-quarter-pitch GRIN lenses 1610 based on Ag-ion exchange glass can provide a NA=0.5 which may be acceptable for typical high-power laser diodes. The optical layout 1620 follows the plano-convex thick lens design where one of the principle planes are inside the lens 1610 and symmetrical. Such GRIN lenses 1610 have similar sizes or smaller than the aspheric lens in the previous embodiment.

Figure 17A:
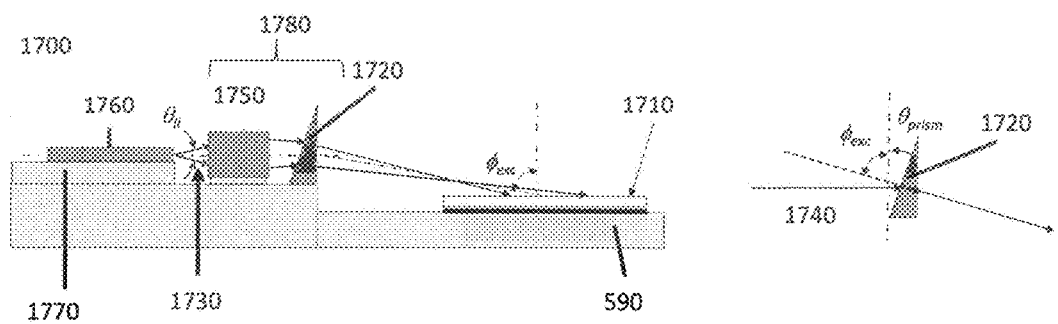
FIG. 17A shows an example of all-planar integrated reflective LARP source, using wedge prism to deflect the pump beam for off-axis excitation.
Figure 17B:
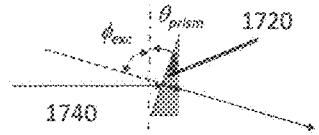
FIG. 17B shows a wedge prism deflection.

FIG. 17A shows fourth embodiment of a LARP system 1700 which is a modified version of the second LARP system embodiment 1400 or third LARP system embodiments 1600, although best suited for the more compact GRIN lens 1750 approach. It may be noted that laser diode pedestal 1770 holds laser diode 1760 in a conventional position rather than at an angle as shown in the previous configurations. By selecting an appropriate optical system 1780, the off-axis effect as discussed above may be assumed. FIG. 17A shows an all-planar integrated reflective LARP source 1710, using wedge prism 1720 to deflect the pump beam 1730 for off-axis excitation. FIG. 17B shows detail of principle ray 1740 going through wedge or prism 1720. FIG. 17A shows where wedge prism 1740 may be placed just after lens 1750 to steer pump beam 1730 rather than relying on placing the laser diode 1760 and lens 1750 off-axis. In this way, all components can be kept planar, making fabrication and assembly of the integrated reflective LARP source 1710 easier.

Figure 18:
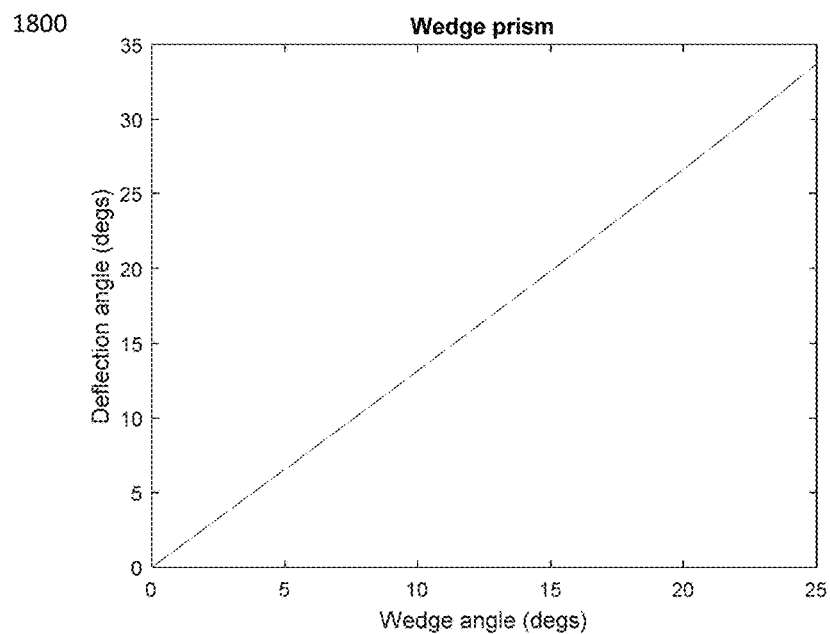
FIG. 18 shows a sample calculation of deflection angle versus prism wedge angle for BK7 glass.

FIG. 18 shows a plot 1800 comprising a sample calculation of deflection angle versus prism wedge angle for BK7 glass. Plot 1800 shows the deflection angle (output angle) versus the wedge angle for a BK7 glass prism. To achieve an excitation angle of roughly 70°, the wedge angle $\theta_{prism} \approx 15°$.

Figure 19:
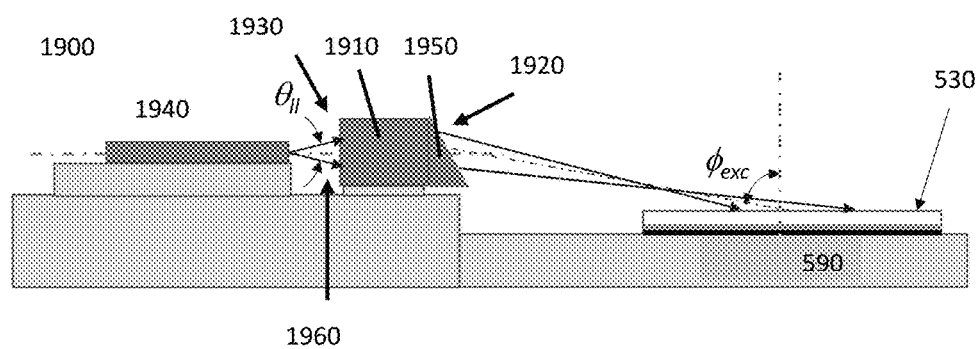
FIG. 19 shows an example of all-planar integrated reflective LARP source, using an angled face on the GRIN lens to perform the functionality of the wedge prism to deflect the pump beam for off-axis excitation.

In a fifth embodiment of a LARP system 1900 shown in FIG. 19, the prism function is integrated into a GRIN lens 1910 by making the output face 1920 of lens 1910 angled with respect to the input face 1930. The angle may be determined by the simple refraction laws, although the spatially varying index of refraction of GRIN lens 1910 implies one must generally resort to ray-tracing to determine the optimal angle. An all-planar integrated reflective LARP source 1940, using an angled output face 1920 on GRIN lens 1910 to perform the functionality of a wedge prism 1950 to deflect a pump beam 1960 for off-axis excitation.

In all of these variations based on a GRIN lens, one could also place the focal plane to be coincident on the laser diode facet. If the focal length of the GRIN lens is on the order of 1 mm or less, then the resulting collimated beam will produce spot sizes projected onto the phosphor of similar millimeter and sub-millimeter diameters.

Figure 20:
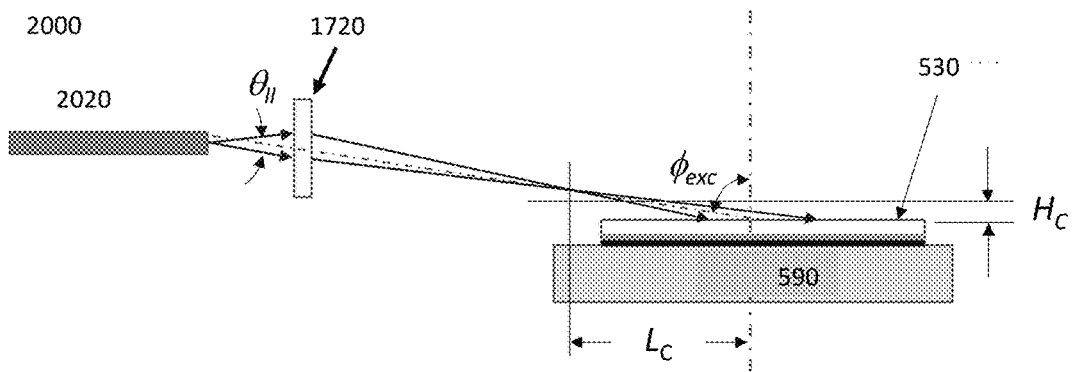
FIG. 20 shows an example of meta-lens pumped reflective LARP source to combine focusing and beam-deflection functions into a single optic.
Figure 21:
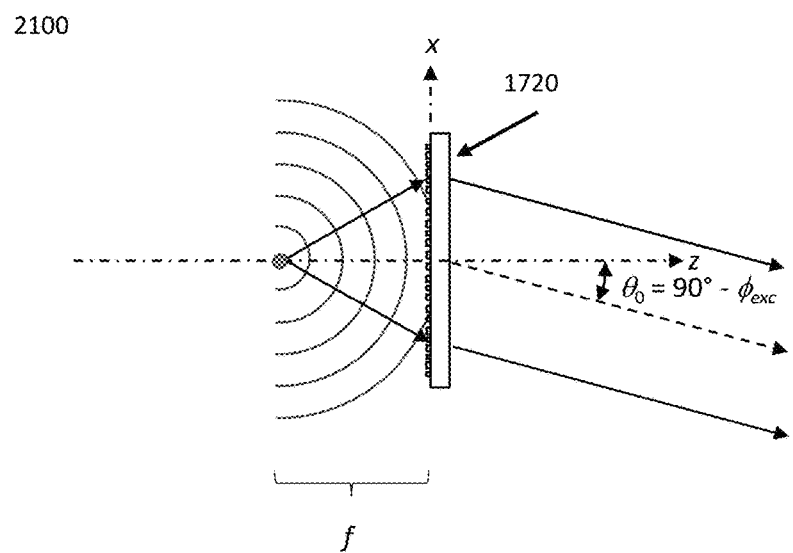
FIG. 21 shows one configuration of the dual-function meta-lens for the LARP system.

In a sixth embodiment of the invention shown in the LARP system 2000 of FIG. 20, lens and prism functions are produced by a meta-lens 2010. Meta-lens 2010 pumped reflective LARP source 2020 may combine focusing and beam-deflection functions into a single optic. Here one can create a nano-structure that both focuses and deflects the focused beam. This type of lens 2010 may be used as a LARP collimating lens. However, this lens 2010 may be designed to have a phase profile that generates a collimated beam parallel to the optic axis when excited by an off-axis point source. This may be accomplished by creating the following phase profile Aφ on the meta-lens surface for meta-lens 2010 configuration shown in FIG. 21:

$$\Delta\phi = \mod_{2\pi}\left[\frac{2\pi}{\lambda}\left(f - \sqrt{f^2 + x^2 + y^2} - x\cos\phi_{exc}\right)\right]. \quad (7)$$

In Equation (7), λ is the center wavelength of the diode laser.

Figure 22A:
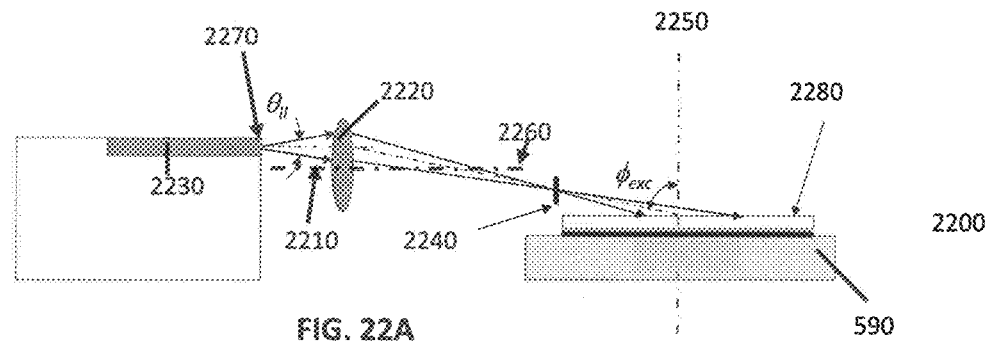
FIG. 22A shows an off-axis geometry with lens parallel to a laser diode facet.

A seventh embodiment of a LARP system 2200 illustrated in FIGS. 22A and B shows another approach in which deflection of the pump light 2210 and focusing may be accomplished with a single optic 2220. In this case, as shown in FIG. 22A, the source light 2210 from the laser diode 2230 is displaced from the optic axis of the lens 2220. Off-axis geometry with lens 2220 may be parallel to laser diode facet 2270. As a result, an image 2240 of the laser diode 2240, shown where the rays cross, may be deflected from the laser diode 2230 position. The amount of displacement determines the excitation angle $\phi_{exc}$ and may be calculated from simple geometric optics. Note that only a portion of the beam illuminates the lens 2220. This implies the bottom portion of the un-illuminated part of lens 2220 may be eliminated, leading to a flat edge that could easily be glued on a flat mount. However, as the light is not centered in the lens 2220, it will have to have a larger diameter to accommodate the fast axis laser diode light $\theta_\perp$.

Figure 22B:
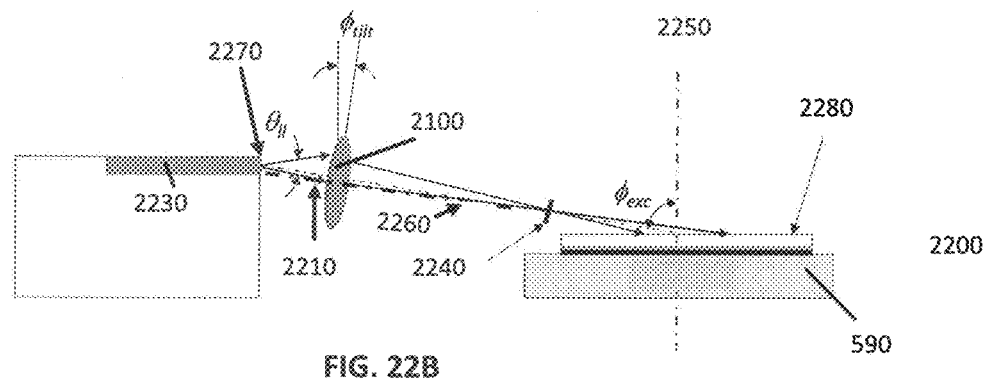
FIG. 22B shows an off-axis geometry with lens tilted with respect to a laser diode facet.

In FIG. 22B, lens 2220 may be tilted with respect to the laser diode facet 2270.

Advantageously, this may improve or provide more flexibility to the incident pump light distribution on phosphor 2280. For example, if the lens optic axis 2260 intersects the laser diode emission region and the center 2250 of the phosphor platelet 2280, then the image 2240 of LD emission region is perpendicular to the optic axis defined by the lens 2220 and should have reduced aberrations that can help projection onto phosphor 2280. In general, one may use standard ray-tracing to optimize the pump illumination pattern, using the tilt angle of the lens as another adjustable parameter.

Figure 23:
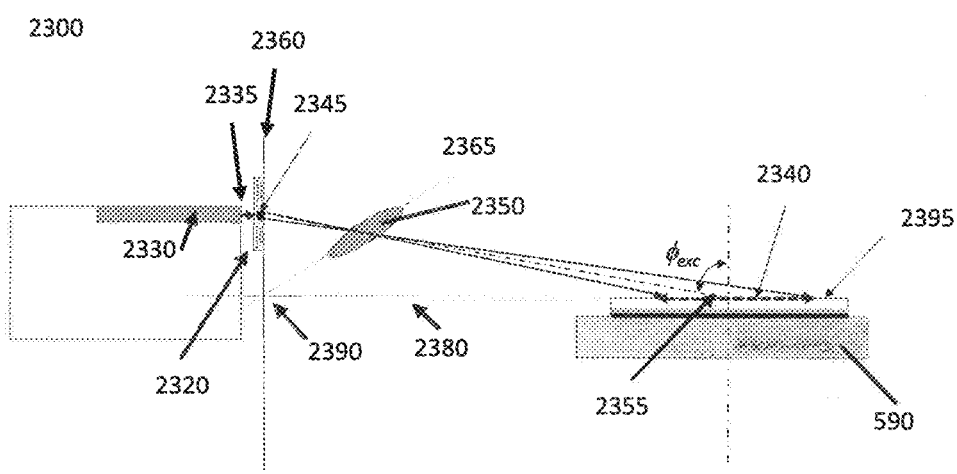
FIG. 23 shows a Scheimpflug configuration to image laser diode spot on diffuser onto a phosphor surface.

In an eighth embodiment of a LARP system 2300 illustrated in FIG. 23, a secondary source may be created using a diffusing plate 2320 very close to the laser diode 2330 to generate a desired pump illumination spot distribution that can be imaged 2340 without defocusing distortions onto the phosphor with a desired magnification. This may be accomplished using a highly tilted lens 2350 in a configuration which may satisfy the Scheimpflug condition. This may be met when the planes defined by the diffuser plane 2360, lens plane 2365, and image plane 2380 all intersect at point 2390 as shown in FIG. 23. Thus a focused and magnified image 2340 of the source distribution may appear on the surface of the phosphor 2395. In general, secondary source 2310 on diffuser 2320 will keep the elliptical far-field emission spot 2355 generated by the laser diode 2330; however, if surface diffuser 2320 may be placed within <100 μm or probably closer to 50 μm, the laser diode intensity distribution can be more circular. This is because the slow axis $\theta_{//}$ light expands from the long axis $\theta_{//}$ of the rectangular emission region 2345 on laser diode cavity, typically on the order <10-50 μm, while the fast axis light expands from the narrow dimension, typically on the order 1 μm or less. Thus at distances away from the laser diode facet 2335 that may be on the order of the long cavity axis width, the beam will be roughly collimated in that dimension while the fast axis light will already have begun expanding after a few microns.

More specifically, the location of roughly circular light from laser diode 2330 may be estimated from the Rayleigh lengths for each of the axes, the distance from the minimum beam waist ω, where the waist increases by a factor of √2. For the slow axis with corresponding cavity width $w_c$, the Rayleigh length $z_{//}$ is given by, $$z_{//} = \omega_{//}^2 \frac{\pi}{\lambda} \approx \left(\frac{w_c}{2}\right)^2 \frac{\pi}{\lambda}. \quad (8)$$

If the condition that the distance z where the diffusing surface is located satisfies $$z = z_{//}, \quad (9)$$

where z is given by the far-field divergence of the fast axis, $$z \approx \frac{\omega_0}{\theta_\perp},\qquad(10)$$

then an approximate secondary circular spot source can be produced by a surface diffuser 2320 and the Scheimpflug configuration can provide approximate imaging of the spot 2355 onto phosphor 2395.

For example, if the laser diode cavity 2375 width is $w_c=20$ μm, then the slow axis Rayleigh length $z_{lf} \approx 700$ μm according to Equation 8. The location of the circular spot may then be given by Equation 10; for the example laser diode parameters described in first embodiment LARP system 500, $\theta_\perp=63.50$ or 1.108 radians. For $\omega_0 \approx w_c/2=10$ μm, $z \approx 9$ μm. The diameter ($1/e^2$) of spot 2355 is $w_c=20$ μm. The condition in Equation 9 is well satisfied.

Diffuser 2320 for this regime may be a true wavelength scale diffractive optical component such that diffusing of the small 10's of micron sized spot 2355 may occur. This may be done through holographic methods, meta-optic, or a scattering layer. It may be desirable to have limited angular diffusion to prevent the diffused light from overfilling lens 2350.

In general, diffuser 2320 in FIG. 23 may not be always necessary as Fourier optics tells us that the geometric thin lens imaging condition also applies to wavefronts, where the imaged wavefront is magnified and convolved by the imaging system point-spread function. Therefore the near-circular wavefront at the location of diffuser 2320 may be magnified and approximately imaged 2340 at phosphor 2395 under the geometric optics imaging conditions. In particular, this may be adapted to the Scheimpflug principle in FIG. 23, where the small circular region very close to a horizontally oriented laser diode 2330 may be directly imaged 2340 onto horizontally oriented phosphor 2395, but removing diffuser 2320 in this case. Note that the wavefront that is incident on phosphor 2395, generated in this way, may contain "hot" spots and diffraction features that are not desirable for direct excitation of phosphor 2395.

In a ninth embodiment, all of these approaches described using a single laser diode may be adapted to multiple laser diodes to increase both luminous flux and luminance. This may incur greater obscuration by the laser diodes, optics, and associated mounting structures.

In a tenth embodiment, the laser diode, optics, and phosphor converter (and sub-mount) may be rotated with respect to the horizontal substrate, such that the off-axis plane is horizontal or some angle in-between horizontal and vertical. In this case, light emission originates from the phosphor oriented in the vertical plane, i.e., emission comes from the side of the package. This may reduce packaging costs for example, provide emission in a more usable orientation or decrease obscuration of the emission spot and emission cone. It may be feasible to also rotate, by arbitrary amounts, some subset of these components for certain applications.

In general, variations of these imaging methods may be employed in the invention as known in the art. For example, the incident pump beam may not have to be tilted to provide exact circularity and applying tilts to other components may compensate if desired. Additionally, the phosphor is not limited to the planer geometry, relative to the substrate, and may be at an angle with respect to the incident pump beam; however, inclining the phosphor with respect to the pump beam may result in greater obstruction of the emitted and scattered light, reducing efficiency of the device. Finally, while the invention is primarily to provide an SMD package for reflective LARP, the device and configurations are not limited to SMD packaging and may be incorporated into other types of miniature packaging.

Example 1 comprises a reflective laser activated remote phosphor (LARP) package comprising: a phosphor platelet oriented in a first plane defined by an x-axis and a y-axis perpendicular to the x-axis; a laser diode positioned to be offset along the x-axis from the phosphor platelet and above the first plane along a z-axis perpendicular to the x-axis and the y-axis, the laser diode comprising: an output facet configured for emitting a laser beam, the laser beam comprising: a slow axis oriented in a first direction along which the laser beam diverges at a first angle; and a fast axis oriented in a second direction along which the laser beam diverges at a second angle greater than the first angle; wherein the laser diode is oriented such that: the laser beam is bisected by the phosphor platelet such that the slow axis of the laser beam is parallel to the x-axis and the fast axis of the laser beam is parallel to the y-axis.

In Example 2, the LARP package of Example 1 further comprising: a phosphor pedestal positioned between the phosphor platelet and a substrate; and a laser diode pedestal positioned between the laser diode and the substrate.

In Example 3, the LARP package of claim 2 wherein the substrate is a planar, thermally conductive substrate.

In Example 4, the LARP package of Example 3 wherein the LARP package is hermetically sealed into an integrated package.

In Example 5, the LARP package of Example 4 wherein at least one of the laser diode die, the laser diode pedestal, the phosphor platelet and/or the phosphor pedestal are surface mounted devices (SMD).

In Example 6, the LARP package of Example 5 wherein the LARP package is an SMD package.

In Example 7, the LARP package of Examples 1-6 further comprising a transparent window positioned along the z-axis above the phosphor platelet such that at least a portion of a light emitted by the phosphor is transmitted through said window.

In Example 8, the LARP package of Example 7 the window further comprising a specular pump block positioned such that at least a portion of the window is rendered opaque.

In Example 9, the LARP package of Example 8 wherein the specular pump block is positioned to block transmission through said window of specular reflection of the laser beam from the surface of the phosphor platelet.

In Example 10, the LARP package of Examples 7-9 further comprising an anti-reflective coating on at least one surface of said window.

In Example 11, the LARP package of Examples 1-10 wherein the laser diode is packaged as a laser diode die.

In Example 12, the LARP package of Examples 1-11 wherein the laser diode is one of a blue laser diode and/or ultra-violet and/or an infra-red laser.

In Example 13, the LARP package of Examples 1-12 wherein the laser diode has a wavelength ranging between 430-460 nanometers.

In Example 14, the LARP package of Examples 1-13 wherein the laser diode is a single-diode multi-quantum well (MQW) laser diode.

In Example 15, the LARP package of Example 14 wherein the laser diode has an active region having a length, width and height.

In Example 16, the LARP package of Example 15 wherein the width is on the order of 1-10 micron, the height is on the order of 1 micron or less, and the length is on the order of hundreds of microns.

In Example 17, the LARP package of Examples 15-16 wherein the laser beam is emitted from the active region, and has an electric field polarization parallel to the width of the active region.

In Example 18, the LARP package of Examples 15-17 wherein slow axis is parallel to the width of the active region.

In Example 19, the LARP package of Examples 15-18 wherein the fast axis is parallel to the height of the active region.

In Example 20, the LARP package of Examples 1-19 wherein the laser beam is bisected by the phosphor platelet at an angle of incidence.

In Example 21, the LARP package of Example 20 wherein the angle of incidence varies along the x-axis from a minimum to a maximum as distance from the laser diode increases.

In Example 22, the LARP package of Example 21 wherein said variance of the angle of incidence is proportional to a magnitude of the first angle.

In Example 23, the LARP package of Examples 20-22 wherein a position of the laser diode is selected such that the angle of incidence corresponds to an angle exceeding the Brewster angle.

In Example 24, the LARP package of Example 17 wherein the Brewster angle is reduced due to the electric field polarization of the laser beam.

In Example 25, the LARP package of Examples 1-10, the phosphor platelet comprising: a reflective coating stack positioned between the phosphor platelet and the phosphor pedestal.

In Example 26, the LARP package of Example 25, wherein the reflective coating stack comprises: a buffer layer arranged on a reflective side of the phosphor; a quenching layer comprising adhesion properties positioned between the buffer layer and a metallization layer; a metal adhesion layer positioned between the metallization layer and a diffusion barrier layer; and an inert solder layer positioned between the diffusion barrier and the phosphor pedestal.

In Example 27, the LARP package of Example 26, wherein the buffer layer is a low refractive index buffer layer comprised of SiO2.

In Example 28, the LARP package of Example 26, wherein the quenching layer is comprised of a high adhesion material.

In Example 29, the LARP package of Example 28, wherein the quenching layer is TiO2.

In Example 30, the LARP package of Example 26, wherein the metallization layer is comprised of Ag.

In Example 31, the LARP package of Example 26, wherein the metal adhesion layer is comprised of Cr.

In Example 32, the LARP package of Example 26, wherein the inert solder layer is comprised of Au.

In Example 33, the LARP package of Example 1-4, wherein a coefficient of thermal expansion of the laser diode is substantially similar to a coefficient of thermal expansion of the laser diode pedestal.

In Example 34, the LARP package of Example 1-4, wherein a coefficient of thermal expansion of the phosphor is substantially similar to a coefficient of thermal expansion of the phosphor pedestal.

In Example 35, the LARP package of Example 1-4, wherein the laser diode pedestal is a wedge shape configured to prevent the scatter of laser beam light In Example 36, the LARP package of Example 1-25, further comprising an optical element positioned between the laser diode and the phosphor platelet.

In Example 37, the LARP package of Example 36, wherein the optical element is positioned such that it intercepts the laser beam.

In Example 38, the LARP package of Example 36-37, wherein the optical element comprises a GRIN lens.

In Example 39, the LARP package of Example 36-37, wherein the optical element comprises a prism.

In Example 40, the LARP package of Example 1-39, wherein the laser diode is positioned at an angle on the laser diode pedestal such that an emission spot on the phosphor surface is substantially circular.

Example 41 comprises a method of arranging a reflective laser activated remote phosphor (LARP) package comprising: orienting a phosphor platelet in a first plane defined by an x-axis and a y-axis perpendicular to the x-axis; positioning a laser diode to be offset along the x-axis from the phosphor platelet and above the first plane along a z-axis perpendicular to the x-axis and the y-axis, the laser diode comprising: an output facet configured for emitting a laser beam, the laser beam comprising: a slow axis oriented in a first direction along which the laser beam diverges at a first angle; and a fast axis oriented in a second direction along which the laser beam diverges at a second angle greater than the first angle; orienting the laser diode is such that: the laser beam is bisected by the phosphor platelet such that the slow axis of the laser beam is parallel to the x-axis and the fast axis of the laser beam is parallel to the y-axis.

In Example 42, the method of Example 41 further comprising: positioning a phosphor pedestal between the phosphor platelet and a substrate; and positioning a laser diode pedestal between the laser diode and the substrate.

In Example 43, the method of Examples 41-42 further comprising hermetically sealing the LARP package into an integrated package.

In Example 44, the method of Examples 41-43 further comprising positioning a transparent window along the z-axis above the phosphor platelet such that at least a portion of a light emitted by the phosphor is transmitted through said window.

In Example 45, the method of Example 44 positioning a specular pump block such that at least a portion of the window is rendered opaque.

In Example 46, the method of Example 45 further comprising positioning the specular pump block to block transmission through said window of specular reflection of the laser beam from the surface of the phosphor platelet.

In Example 47, the method of Examples 41 further comprising emitting the laser beam from an active region of the laser diode, wherein an electric field polarization parallel to the width of the active region.

In Example 48, the method of Examples 41-47 further comprising bisecting the laser beam with the phosphor platelet at an angle of incidence.

In Example 49, the method of Example 41 further comprising positioning the laser diode such that an angle of incidence corresponds to an angle exceeding a Brewster angle.

In Example 50, the method of Examples 41-49, further comprising positioning a reflective coating stack between the phosphor platelet and the phosphor pedestal.

In Example 51, the method of Example 41-50, further comprising positioning an optical element between the laser diode and the phosphor platelet such that the optical element intercepts the laser beam.

In Example 52, the method of Example 41-51, further comprising positioning the laser diode at an angle on the laser diode pedestal such that an emission spot on the phosphor surface is substantially circular.

Example 53 comprises a reflective laser activated remote phosphor (LARP) package comprising: a phosphor platelet oriented in a first plane defined by an x-axis and a y-axis perpendicular to the x-axis; a laser diode positioned to be offset along the x-axis from the phosphor platelet and above the first plane along a z-axis perpendicular to the x-axis and the y-axis, the laser diode comprising: an output facet configured for emitting a laser beam, the laser beam comprising: a slow axis oriented in a first direction along which the laser beam diverges at a first angle; and a fast axis oriented in a second direction along which the laser beam diverges at a second angle greater than the first angle; wherein the laser diode is oriented such that: the laser beam is bisected by the phosphor platelet such that the slow axis of the laser beam lies in an x-z plane and the fast axis of the laser beam is perpendicular to an x-z plane.

In Example 54, the LARP package of Example 53 further comprising: a phosphor pedestal positioned between the phosphor platelet and a substrate; and a laser diode pedestal positioned between the laser diode and the substrate.

In Example 55, the LARP package of Examples 53-54 wherein the LARP package is hermetically sealed into an integrated package.

In Example 56, the LARP package of Examples 53-55 further comprising a transparent window positioned in an y-z plane above the phosphor platelet such that at least a portion of a light emitted by the phosphor is transmitted through said window.

In Example 57, the LARP package of Example 56, the window further comprising a specular pump block positioned such that at least a portion of the window is rendered opaque.

In Example 58, the LARP package of Examples 54-57 wherein a position of the laser diode is selected such that the angle of incidence corresponds to an angle exceeding the Brewster angle.

In Example 59, the LARP package of Example 58, wherein the position of the laser diode is further selected such that the angle of the laser diode on the laser diode pedestal such that an emission spot on the phosphor surface is substantially circular.

In Example 60, the LARP package of claims 53-59, further comprising an optical element positioned between the laser diode and the phosphor platelet.

Example 61 comprises a method of arranging a reflective laser activated remote phosphor (LARP) package comprising: orienting a phosphor platelet in a first plane defined by an x-axis and a y-axis perpendicular to the x-axis; positioning a laser diode to be offset along the x-axis from the phosphor platelet and above the first plane along a z-axis perpendicular to the x-axis and the y-axis, the laser diode comprising: an output facet configured for emitting a laser beam, the laser beam comprising: a slow axis oriented in a first direction along which the laser beam diverges at a first angle; and a fast axis oriented in a second direction along which the laser beam diverges at a second angle greater than the first angle; orienting the laser diode is such that: the laser beam bisects the phosphor platelet such that the slow axis of the laser beam is in an x-z plane and the fast axis of the laser beam is perpendicular to an x-z plane.

In Example 62, the method of Example 61 further comprising: positioning a phosphor pedestal between the phosphor platelet and a substrate; and positioning a laser diode pedestal between the laser diode and the substrate.

In Example 63, the method of Examples 61-62 further comprising hermetically sealing the LARP package into an integrated package.

In Example 64, the method Example 63 further comprising positioning a transparent window along the z-axis above the phosphor platelet such that at least a portion of a light emitted by the phosphor is transmitted through said window.

In Example 65, the method of Example 64 comprising positioning a specular pump block such that at least a portion of the window is rendered opaque.

In Example 66, the method of Example 65 further comprising positioning the specular pump block to block transmission through said window of specular reflection of the laser beam from the surface of the phosphor platelet.

In Example 67, the method of Examples 61-66 further comprising emitting the laser beam from an active region of the laser diode, wherein an electric field polarization is parallel to a plane of incidence onto the phosphor.

In Example 68, the method of Examples 61-67, further comprising positioning an optical element between the laser diode and the phosphor platelet such that the optical element intercepts the laser beam.

In Example 69, the method of Examples 62-68, further comprising positioning the laser diode at an angle on the laser diode pedestal such that an emission spot on the phosphor surface is substantially circular.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A reflective laser activated remote phosphor (LARP) package comprising:
    a phosphor platelet oriented in a first plane defined by a z-axis and a y-axis perpendicular to the z-axis;
    a laser diode positioned to be offset along the z-axis from the phosphor platelet and above the first plane along an x-axis perpendicular to the z-axis and the y-axis, the laser diode comprising:
        an output facet configured for emitting a laser beam, the laser beam comprising:
            a slow axis oriented in a first direction along which the laser beam diverges at a first angle; and
            a fast axis oriented in a second direction along which the laser beam diverges at a second angle greater than the first angle;
    wherein the laser diode is oriented such that the laser beam is bisected by the phosphor platelet such that the slow axis of the laser beam lies in a x-z plane and the fast axis of the laser beam is perpendicular to the x-z plane.

2. The LARP package of claim 1, further comprising:
    a phosphor pedestal positioned between the phosphor platelet and a substrate; and
    a laser diode pedestal positioned between the laser diode and the substrate.

3. The LARP package of claim 2, wherein the LARP package is hermetically sealed into an integrated package.

4. The LARP package of claim 2, wherein a position of the laser diode is selected such that the angle of incidence corresponds to an angle exceeding the Brewster angle.

5. The LARP package of claim 4, wherein the position of the laser diode is further selected such that the angle of the laser diode on the laser diode pedestal such that an emission spot on a surface of the phosphor platelet is substantially circular.

6. The LARP package of claim 1, further comprising a transparent window positioned in a y-z plane above the phosphor platelet such that at least a portion of a light emitted by the phosphor is transmitted through said window.

7. The LARP package of claim 6, the window further comprising a specular pump block positioned such that at least a portion of the window is rendered opaque.

8. The LARP package of claim 1, further comprising an optical element positioned between the laser diode and the phosphor platelet.

9. The LARP package of claim 8, wherein the optical element is configured to deflect the laser beam such that an emission spot on the phosphor surface is substantially circular.

10. A method of arranging a reflective laser activated remote phosphor (LARP) package comprising:
orienting a phosphor platelet in a first plane defined by a z-axis and a y-axis perpendicular to the z-axis;
positioning a laser diode to be offset along the z-axis from the phosphor platelet and above the first plane along an x-axis perpendicular to the z-axis and the y-axis, the laser diode comprising:
an output facet configured for emitting a laser beam, the laser beam comprising:
a slow axis oriented in a first direction along which the laser beam diverges at a first angle; and
a fast axis oriented in a second direction along which the laser beam diverges at a second angle greater than the first angle;
orienting the laser diode is such that the laser beam bisects the phosphor platelet such that the slow axis of the laser beam is in a x-z plane and the fast axis of the laser beam is perpendicular to the x-z plane.

11. The method of claim 10, further comprising:
positioning a phosphor pedestal between the phosphor platelet and a substrate; and
positioning a laser diode pedestal between the laser diode and the substrate.

12. The method of claim 11, further comprising positioning the laser diode at an angle on the laser diode pedestal such that an emission spot on the phosphor surface is substantially circular.

13. The method of claim 10, further comprising hermetically sealing the LARP package into an integrated package.

14. The method claim 13, further comprising positioning a transparent window along the z-axis above the phosphor platelet such that at least a portion of a light emitted by the phosphor is transmitted through said window.

15. The method of claim 14, further comprising positioning a specular pump block such that at least a portion of the window is rendered opaque.

16. The method of claim 15, further comprising positioning the specular pump block to block transmission through said window of specular reflection of the laser beam from a surface of the phosphor platelet.

17. The method of claim 10, further comprising emitting the laser beam from an active region of the laser diode, wherein an electric field polarization is parallel to a plane of incidence onto the phosphor.

18. The method of claim 10, further comprising positioning an optical element between the laser diode and the phosphor platelet such that the optical element intercepts the laser beam.

* * * * *